United States Patent
Wallace et al.

(10) Patent No.: US 10,559,529 B2
(45) Date of Patent: Feb. 11, 2020

(54) PITCH DIVISION PATTERNING APPROACHES WITH INCREASED OVERLAY MARGIN FOR BACK END OF LINE (BEOL) INTERCONNECT FABRICATION AND STRUCTURES RESULTING THEREFROM

(71) Applicant: Intel Corporation, Santa Clara, CA (US)

(72) Inventors: Charles H. Wallace, Portland, OR (US); Leonard P. Guler, Hillsboro, OR (US); Manish Chandhok, Beaverton, OR (US); Paul A. Nyhus, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/069,154

(22) PCT Filed: Mar. 28, 2016

(86) PCT No.: PCT/US2016/024553
§ 371 (c)(1),
(2) Date: Jul. 10, 2018

(87) PCT Pub. No.: WO2017/171715
PCT Pub. Date: Oct. 5, 2017

(65) Prior Publication Data
US 2019/0019748 A1   Jan. 17, 2019

(51) Int. Cl.
*H01L 23/52*        (2006.01)
*H01L 23/528*       (2006.01)
(Continued)

(52) U.S. Cl.
CPC ...... *H01L 23/528* (2013.01); *H01L 21/76834* (2013.01); *H01L 23/5329* (2013.01)

(58) Field of Classification Search
CPC ........... H01L 21/7682; H01L 21/76885; H01L 21/76834; H01L 23/5329; H01L 21/0337; H01L 21/76816; H01L 21/76807
See application file for complete search history.

(56) References Cited

U.S. PATENT DOCUMENTS 6,451,667 B1 *   9/2002   Ning ................. H01L 28/82
                                             257/267
8,497,157 B2    7/2013   Moon et al.
(Continued)

FOREIGN PATENT DOCUMENTS

KR   10-2012-0124634       11/2012
WO   WO-2015-047321         4/2015

OTHER PUBLICATIONS

International Search Report and Written Opinion for International Patent Application No. PCT/US2016/024553 dated Dec. 20, 2016, 10 pgs.

(Continued)

*Primary Examiner* — William Coleman
(74) *Attorney, Agent, or Firm* — Schwabe, Williamson & Wyatt, P.C.

(57) ABSTRACT

Pitch division patterning approaches with increased overlay margin for back end of line (BEOL) interconnect fabrication, and the resulting structures, are described. In an example, a method includes forming a first plurality of conductive lines in a first sacrificial material formed above a substrate. The first plurality of conductive lines is formed along a direction of a BEOL metallization layer and is spaced apart by a pitch. The method also includes removing the first sacrificial material, forming a second sacrificial material adjacent to sidewalls of the first plurality of conductive lines, and then forming a second plurality of conductive lines adjacent the second sacrificial material. The second plurality of conductive lines is formed along the (Continued)

direction of the BEOL metallization layer, is spaced apart by the pitch, and is alternating with the first plurality of conductive lines. The method also includes removing the second sacrificial layer.

26 Claims, 10 Drawing Sheets

(51) Int. Cl.
*H01L 21/768* (2006.01)
*H01L 23/532* (2006.01)

(56) References Cited

U.S. PATENT DOCUMENTS

| | | | |
|---|---|---|---|
| 8,530,963 B2* | 9/2013 | Davies | H01L 29/0661 257/333 |
| 2012/0315753 A1 | 12/2012 | Farooq et al. | |
| 2013/0328198 A1 | 12/2013 | Chou et al. | |
| 2016/0027727 A1* | 1/2016 | Kim | H01L 21/764 257/774 |
| 2016/0056104 A1 | 2/2016 | Bouche et al. | |

OTHER PUBLICATIONS

International Preliminary Report on Patentability for International Patent Application No. PCT/US2016/024553, dated Oct. 11, 2018, 7 pages.

\* cited by examiner

PITCH DIVISION PATTERNING APPROACHES WITH INCREASED OVERLAY MARGIN FOR BACK END OF LINE (BEOL) INTERCONNECT FABRICATION AND STRUCTURES RESULTING THEREFROM

CROSS-REFERENCE TO RELATED APPLICATION

This patent application is a U.S. National Phase Application under 35 U.S.C. § 371 of International Application No. PCT/US2016/024553, filed Mar. 28, 2016, entitled "PITCH DIVISION PATTERNING APPROACHES WITH INCREASED OVERLAY MARGIN FOR BACK END OF LINE (BEOL) INTERCONNECT FABRICATION AND STRUCTURES RESULTING THEREFROM," which designates the United States of America, the entire disclosure of which is hereby incorporated by reference in its entirety and for all purposes.

TECHNICAL FIELD

Embodiments of the invention are in the field of semiconductor structures and processing and, in particular, pitch division patterning approaches with increased overlay margin for back end of line (BEOL) interconnect fabrication, and the resulting structures.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Integrated circuits commonly include electrically conductive microelectronic structures, which are known in the arts as vias, to electrically connect metal lines or other interconnects above the vias to metal lines or other interconnects below the vias. Vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

In the past, the sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). One measure of the size of the vias is the critical dimension of the via opening. One measure of the spacing of the vias is the via pitch. Via pitch represents the center-to-center distance between the closest adjacent vias.

When patterning extremely small vias with extremely small pitches by such lithographic processes, several challenges present themselves, especially when the pitches are around 70 nanometers (nm) or less and/or when the critical dimensions of the via openings are around 35 nm or less. One such challenge is that the overlay between the vias and the overlying interconnects, and the overlay between the vias and the underlying landing interconnects, generally need to be controlled to high tolerances on the order of a quarter of the via pitch. As via pitches scale ever smaller over time, the overlay tolerances tend to scale with them at an even greater rate than lithographic equipment is able to keep up.

Another such challenge is that the critical dimensions of the via openings generally tend to scale faster than the resolution capabilities of the lithographic scanners. Shrink technologies exist to shrink the critical dimensions of the via openings. However, the shrink amount tends to be limited by the minimum via pitch, as well as by the ability of the shrink process to be modeled sufficiently accurately, and to not significantly compromise line width roughness (LWR) and/or critical dimension uniformity (CDU).

Yet another such challenge is that the LWR and/or CDU characteristics of photoresists generally need to improve as the critical dimensions of the via openings decrease in order to maintain the same overall fraction of the critical dimension budget. However, currently the LWR and/or CDU characteristics of most photoresists are not improving as rapidly as the critical dimensions of the via openings are decreasing.

A further such challenge is that the extremely small via pitches generally tend to be below the resolution capabilities of even extreme ultraviolet (EUV) lithographic scanners. As a result, commonly two, three, or more different lithographic masks may be used, which tend to increase the costs. At some point, if pitches continue to decrease, it may not be possible, even with multiple masks, to print via openings for these extremely small pitches using EUV scanners. The above factors are also relevant for considering placement and scaling of dielectric plugs or metal line ends among the metal lines of back end of line (BEOL) metal interconnect structures.

Thus, improvements are needed in the area of back end metallization manufacturing technologies for fabricating metal lines, metal vias, and dielectric plugs.

BRIEF DESCRIPTION OF THE DRAWINGS

FIG. 1A illustrates a starting structure following formation of a sacrificial layer above an ILD layer, and a hardmask layer above the sacrificial layer;

FIG. 1B illustrates the structure of FIG. 1A following patterning of the hardmask layer and the sacrificial layer;

FIG. 1C illustrates the structure of FIG. 1B following underlying via location patterning;

FIG. 1D illustrates the structure of FIG. 1C following a first metallization process;

FIG. 1E illustrates the structure of FIG. 1D following exposure of the interconnect lines;

FIG. 1F illustrates the structure of FIG. 1E following formation of a conformal patterning layer;

FIG. 1G illustrates the structure of FIG. 1F following formation of spacer lines from the spacer material layer;

FIG. 1H illustrates the structure of FIG. 1G following formation of a plug placeholder layer;

FIG. 1I illustrates the structure of FIG. 1H following patterning of the plug placeholder layer;

FIG. 1J illustrates the structure of FIG. 1I following a second metallization process;

FIG. 1K illustrates the structure of FIG. 1J following exposure of the two sets of interconnect lines; and FIG. 1L illustrates the structure of FIG. 1K following formation of a permanent ILD layer.

DESCRIPTION OF THE EMBODIMENTS

Figure 1A:
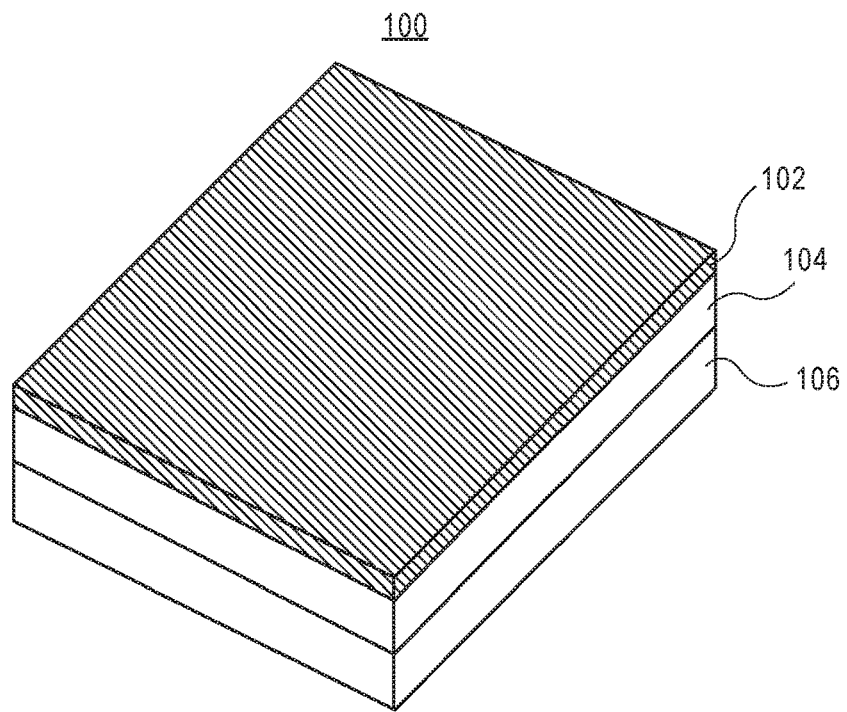
FIGS. 1A-1L illustrate angled cross-sectional views of portions of integrated circuit layers representing various operations in a method involving pitch division patterning with increased overlay margin for back end of line (BEOL) interconnect fabrication, in accordance with an embodiment of the present invention, where.

Pitch division patterning approaches with increased overlay margin for back end of line (BEOL) interconnect fabrication, and the resulting structures, are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be appreciated that the various embodiments shown in the Figures are illustrative representations and are not necessarily drawn to scale.

One or more embodiments described herein are directed to pitch division patterning process flows that increase overlay margins for vias, cuts and plugs. Embodiments may enable continued scaling of the pitch of metal layers beyond the resolution capability of state-of-the art lithography equipment. In an embodiment, spacing between metal lines is constant and can be controlled to Angstrom level precision using ALD. In an embodiment, a process flow is designed so that a "replacement ILD" flow is possible. That is, the ILD can be deposited after the pattern and metallization is complete. The patterning flows typically damage the ILD through the etch/cleans steps but in this flow, the ILD can be deposited last and therefore avoid damage during patterning.

To provide context, edge placement error of via, cut and plug patterning is problematic when feature sizes and pitches are scaled. State of the art solutions to address such problems involve either attempts to tighten edge placement error by improving scanner overlay and improving CD control or attempts to use super-self aligned integration approaches. By contrast, embodiments described herein involve implementation of a process that can achieve similar improvements in edge placement error margin without requiring improvements in lithographic tooling or super-self alignment.

In accordance with an embodiment of the present invention, metal lines are fabricated in two separate operation sequences in order to double the amount of overlay margin for cuts/plugs and via patterning. In a first portion of an exemplary process flow, conventional pitch division methods are used to pattern metal lines, plugs and then vias into an interlayer dielectric material. In a second portion of the exemplary process flow, trenches/via openings are filled with metal (e.g., dual damascene metallization) and then polished. Sacrificial hardmask layers are then removed in between the metal lines. The metal lines are then coated with a sacrificial dielectric material using, e.g., atomic layer deposition (ALD). In a third portion of the exemplary process flow, an isotropic spacer etch is performed to expose bottoms of the trenches. Using a plug patterning flow, dielectric material is added to the locations where metal lines ends should occur, and via etches are completed on the complementary metal lines. The metal from the first metal lines acts as an etch stop to prevent etching in these locations. In a fourth portion of the exemplary process flow, trenches are filled with metal and polished to expose the metal. After polish, sacrificial hardmask material is removed and, optionally, replaced with a dielectric material and then polished again to finish the metallization process. By tuning the deposition of the dielectric material, airgaps can be inserted as well. Additionally, embodiments may involve use of a sacrificial hardmask material instead of metal. The sacrificial hardmask could be removed and replaced with metal at the "second" metallization operation.

To provide further context, issues associated with across die/wafer etch non-uniformity can reduce yield and/or performance of fabricated semiconductor structures. One or more embodiments described herein offer a more efficient approach to patterning by maximizing the overlay process window, minimizing the size and shape of required patterns, and increasing the efficiency of the lithography process to pattern holes or plugs.

More specifically, one or more embodiments are directed to an approaches for fabricating metal lines as well as the conductive vias and non-conductive spaces or interruptions between metals lines (referred to as "plugs"). Vias, by definition, are used to land on a previous layer metal pattern. In this vein, embodiments described herein enable a more robust interconnect fabrication scheme since constraints on lithography equipment is relaxed. Such an interconnect fabrication scheme can be used to save numerous alignment/exposures, and can be used to reduce total process operations and processing time otherwise required for patterning such features using conventional approaches. In an embodiment, his approach also doubles the edge placement error budget allowed for via and plug patterning from ¼ pitch to ½ pitch edge placement error. This may be accomplished since each set of populations of lines (e.g., that are self-aligned to one another) are patterned independently.

In an exemplary processing scheme, FIGS. 1A-1L illustrate angled cross-sectional views of portions of integrated circuit layers representing various operations in a method involving pitch division patterning with increased overlay margin for back end of line (BEOL) interconnect fabrication, in accordance with an embodiment of the present invention.

Referring to FIG. 1A, a starting point structure 100 is provided as a beginning point for fabricating a new metallization layer. The starting point structure 100 includes a hardmask layer 102 disposed on a sacrificial layer 104 disposed on an inter-layer dielectric (ILD) layer 106. As described below, the ILD layer may be disposed above a substrate and, in one embodiment, is disposed over an underlying metallization layer. In one embodiment, the hardmask layer 102 is a silicon nitride (SiN) or titanium nitride hardmask layer. In one embodiment, the sacrificial layer is a silicon layer such as a polycrystalline silicon layer or an amorphous silicon layer.

Figure 1B:
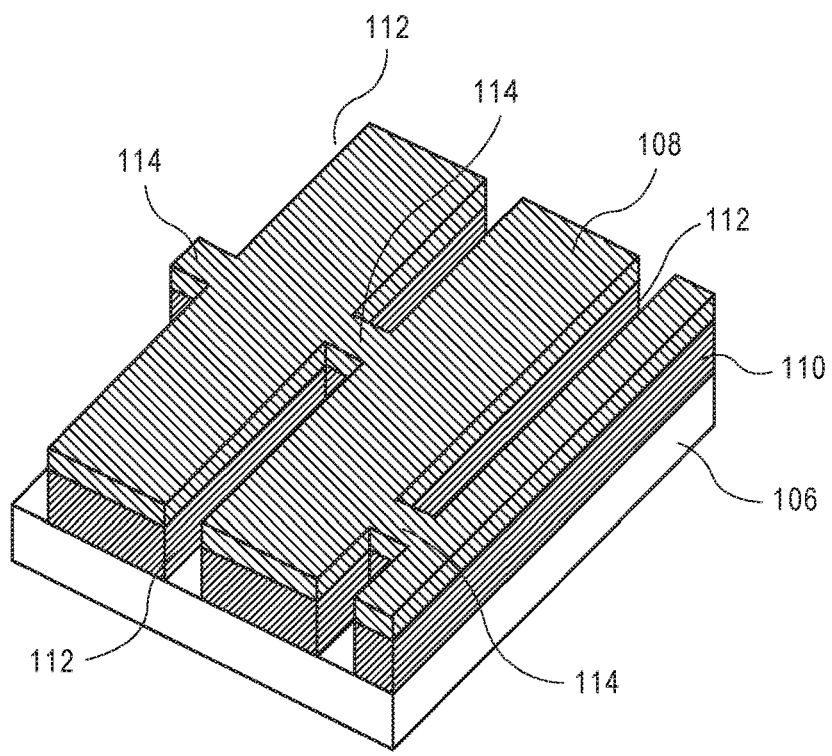

Referring to FIG. 1B, the hardmask layer 102 and the sacrificial layer 104 of the structure of FIG. 1B are patterned. The hardmask layer 102 and the sacrificial layer 104 are patterned to form patterned hardmask layer 108 and patterned sacrificial layer 110, respectively. Patterned hardmask layer 108 and patterned sacrificial layer 110 include a pattern of first line openings 112 and line end regions 114. In an embodiment, a silicon sacrificial layer is suitable for patterning to fine features using an anisotropic plasma etch process. In an embodiment, a lithographic resist mask exposure and etch process is used to form patterned hardmask layer 108 and patterned sacrificial layer 110, with subsequent removal of the resist layer or stack. In an embodiment, the first line openings 112 have a grating type pattern, as is depicted in FIG. 1B. In an embodiment, a pitch division patterning scheme is used to form the pattern of first line openings 112. Examples of suitable pitch division schemes are described in greater detail below. A subsequent line "cut" or plug preservation lithography process may then be used to define line end regions 114.

Figure 1C:
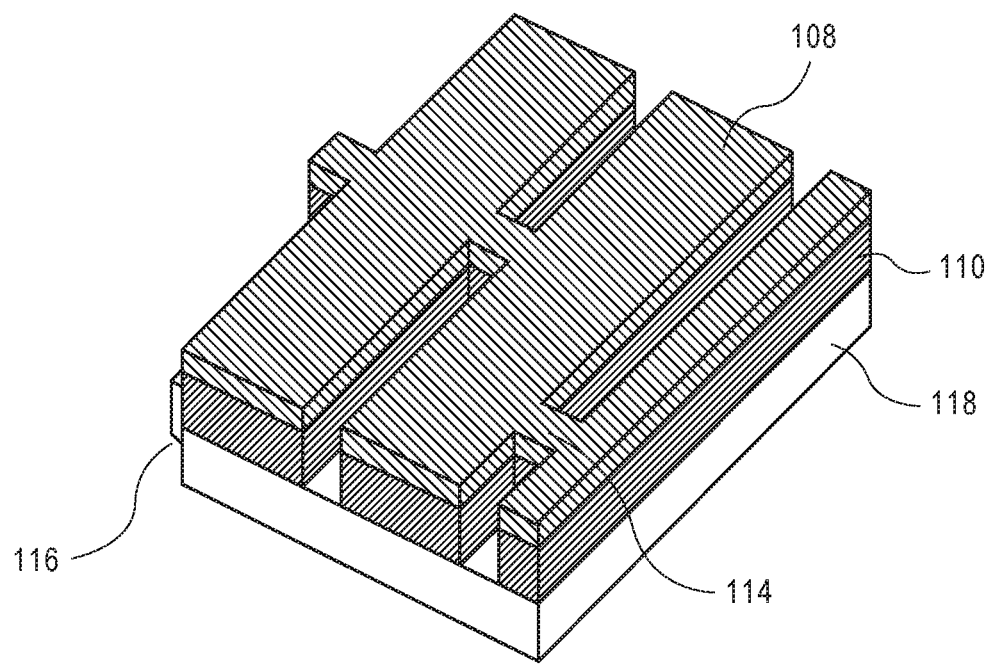

FIG. 1C illustrates the structure of FIG. 1B following underlying via location patterning. Via openings 116 may be formed at select locations of the ILD layer 106 to form patterned ILD layer 118. In an embodiment, vias are patterned using a self-aligned via process. The select locations are formed within regions of the ILD layer 106 exposed by the first line openings 112. In an embodiment, a separate lithographic and etch process is used to form via openings 116 subsequent to the lithographic patterning process used to form first line openings 112.

Figure 1D:
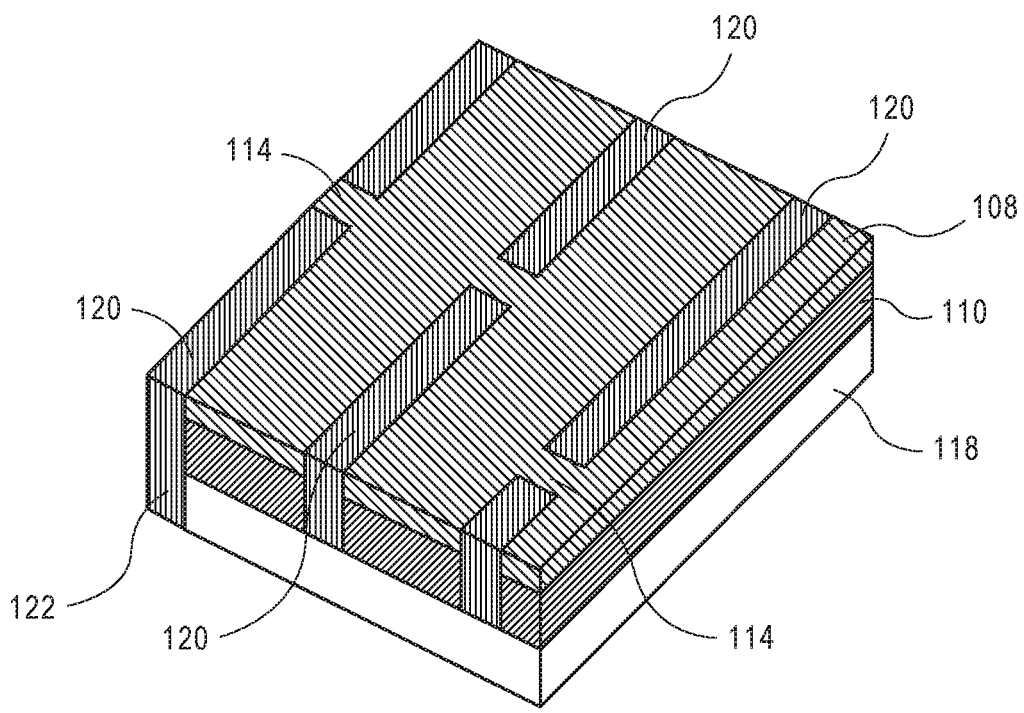

FIG. 1D illustrates the structure of FIG. 1C following a first metallization process. In an embodiment, a dual-damascene metallization process is used where vias and metal lines are filled at the same time. Interconnect lines 120 and conductive vias 120 are formed in the first line openings and the via openings 116. In an embodiment, a metal fill process is performed to provide interconnect lines 120 and conductive vias 120. In an embodiment, the metal fill process is performed using a metal deposition and subsequent planarization processing scheme, such as a chemical mechanical planarization (CMP) process. In the case that the patterned sacrificial hardmask layer 110 is composed substantially of silicon, a liner material may be deposited prior to forming a conductive fill layer, in order to inhibit silicidation of the patterned sacrificial hardmask layer 110.

Figure 1E:
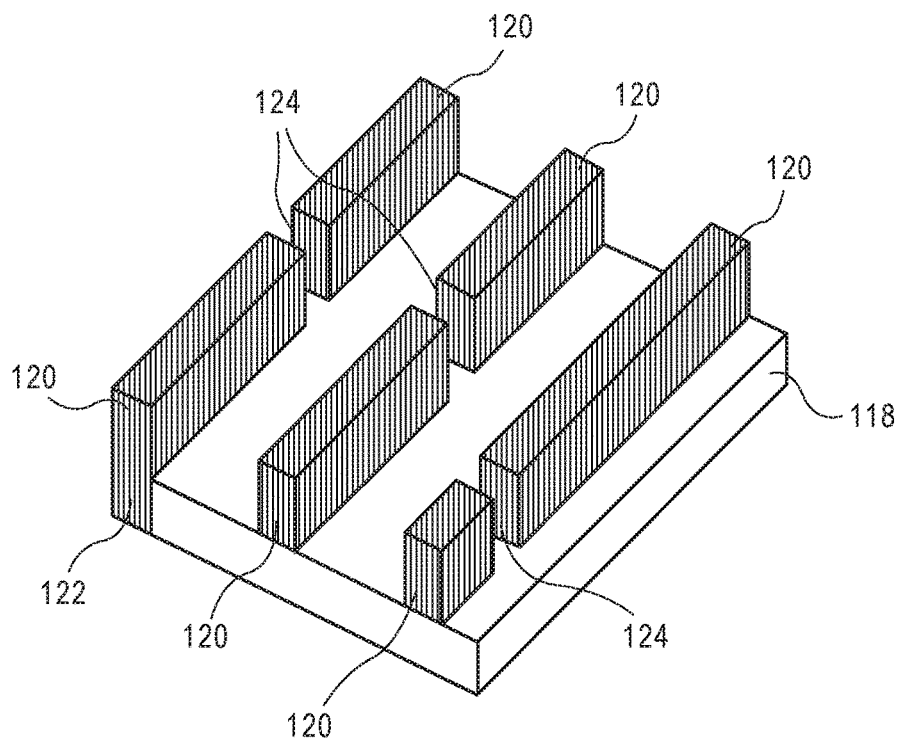

FIG. 1E illustrates the structure of FIG. 1D following exposure of the interconnect lines 120. The patterned hardmask layer 108 and the patterned sacrificial layer 110 are removed to leave interconnect lines 120 exposed, with underlying conductive vias in the patterned ILD layer 118. Line end openings 124 are revealed. Line end openings 124 provide breaks in the grating pattern of the interconnect lines 120. In an embodiment, the patterned hardmask layer 108 and the patterned sacrificial layer 110 are removed using a selective wet etch process.

Figure 1F:
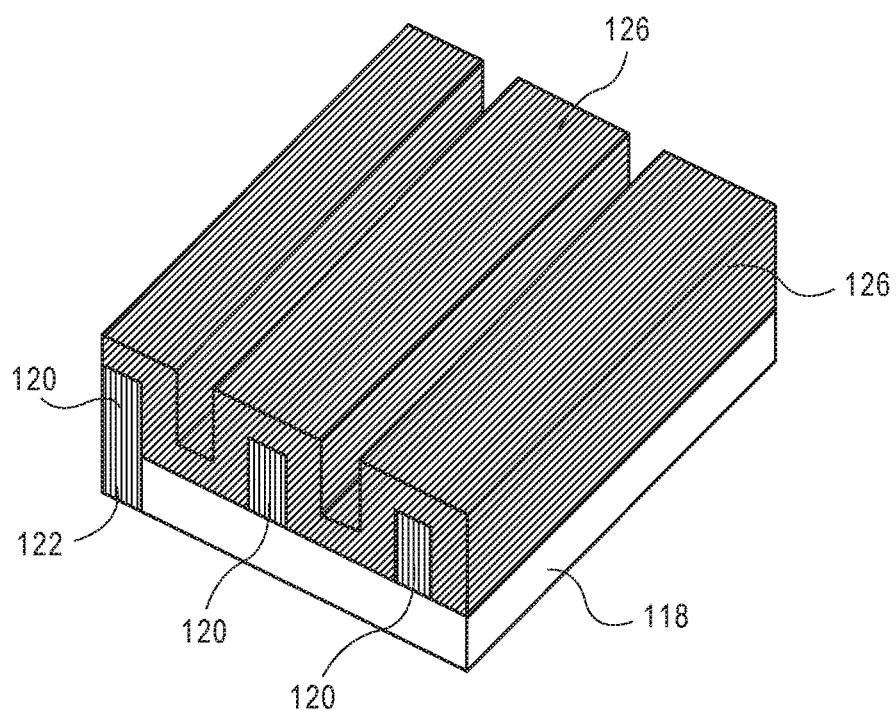

FIG. 1F illustrates the structure of FIG. 1E following formation of a conformal patterning layer. A spacer material layer 126 is formed over and conformal with the grating pattern of the interconnect lines 120. In an embodiment, atomic layer deposition (ALD) is used due to the fact that it is 'perfectly' conformal and extremely accurate (e.g., control to the Angstrom level). It is to be appreciated that the line end openings 124 are, in an embodiment, too short to effectively disrupt the general grating pattern of the interconnect lines 120 with respect to formation of the conformal spacer material layer 126. In one such embodiment, the line end openings 124 are filled with the spacer material layer 126 without disrupting the general grating pattern of the interconnect lines 120. In an embodiment, the spacer material layer 126 is deposited using a chemical vapor deposition (CVD) or atomic layer deposition (ALD) process. In one embodiment, the spacer material layer 126 is a silicon layer such as a polycrystalline silicon layer or an amorphous silicon layer. In a specific such embodiment, a liner material is deposited on the interconnect lines 120 prior to forming a silicon spacer material layer, in order to inhibit silicidation of the spacer material layer 126. In an embodiment, the line end cuts (plugs) must be less than or equal to 2× the spacer thickness so that they are completely filled with the conformal dielectric material. If they are larger than 2× the thickness, seams may form and metal may short the lines together during subsequent processing.

Figure 1G:
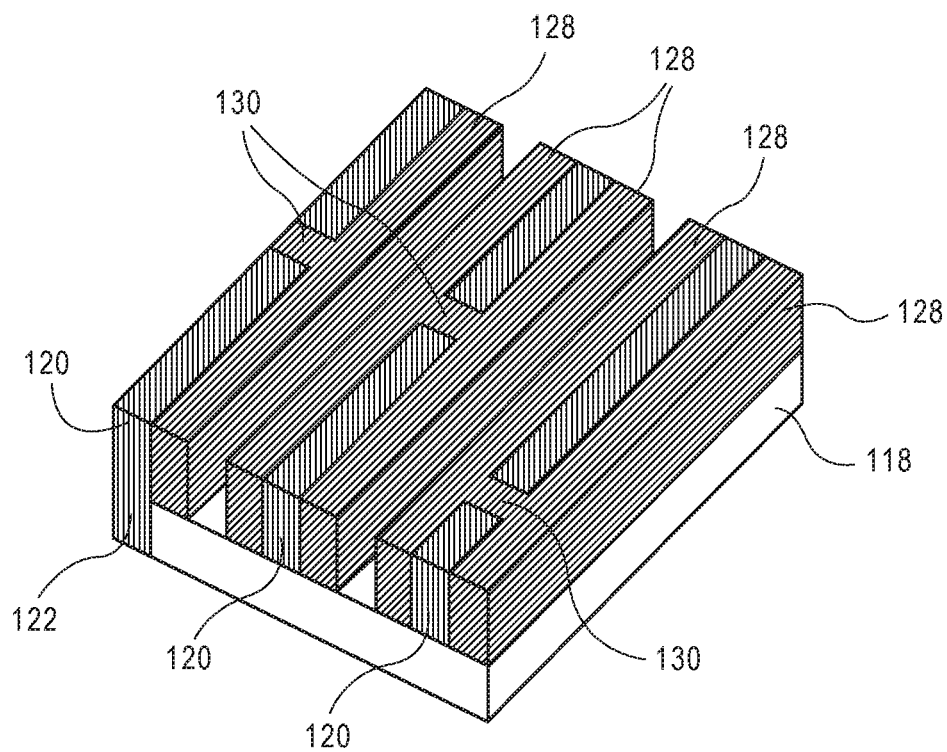

FIG. 1G illustrates the structure of FIG. 1F following formation of spacer lines from the spacer material layer. In an embodiment, spacers 128 are formed along the sidewalls of interconnect lines 120 using an anisotropic plasma etching process. In one embodiment, the spacer material layer 126 remains in the line end openings 124 to form line end placeholder portions 130 for interconnect lines 120.

Figure 1H:
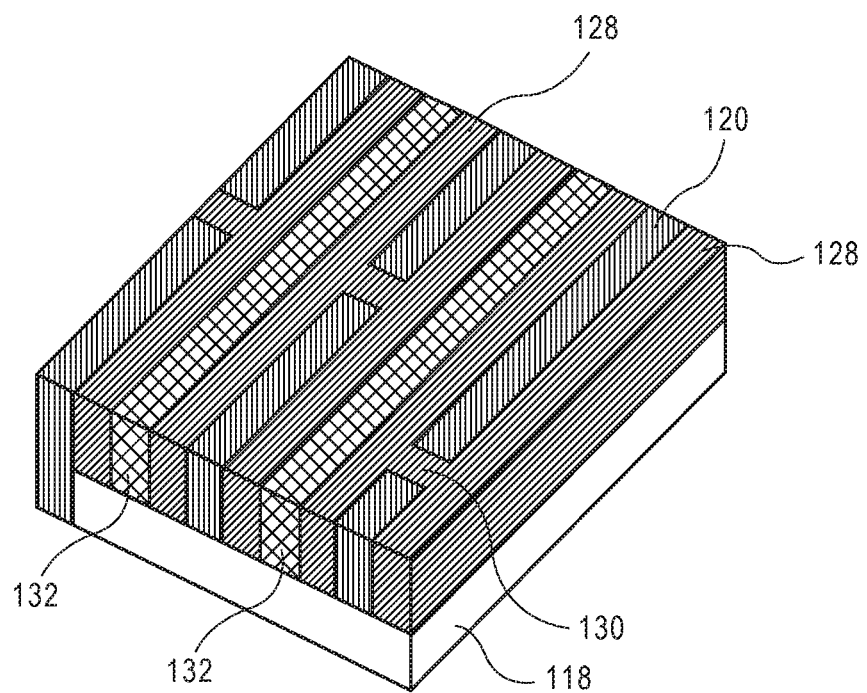

FIG. 1H illustrates the structure of FIG. 1G following formation of a plug placeholder layer. A plug placeholder layer 132 is formed between spacers 128 of adjacent interconnect lines 120. The plug placeholder layer 132 is initially formed in locations where a second set of interconnect lines will ultimately be formed. In an embodiment, the plug placeholder layer 132 is formed using a deposition and planarization process, confining the plug placeholder layer 132 between the spacers 128.

Figure 1I:
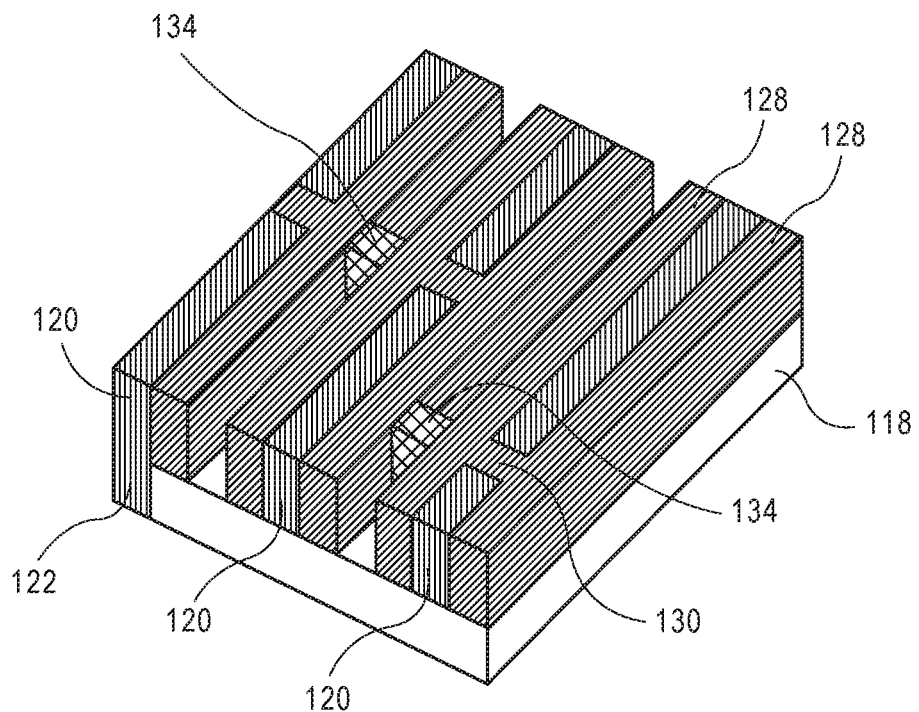

FIG. 1I illustrates the structure of FIG. 1H following patterning of the plug placeholder layer. The plug placeholder layer 132 is patterned to retain plug placeholders 134 in select locations where line ends are ultimately formed. In an embodiment, a lithographic resist mask exposure and etch process is used to form plug placeholders 134, with subsequent removal of the resist layer or stack.

Figure 1J:
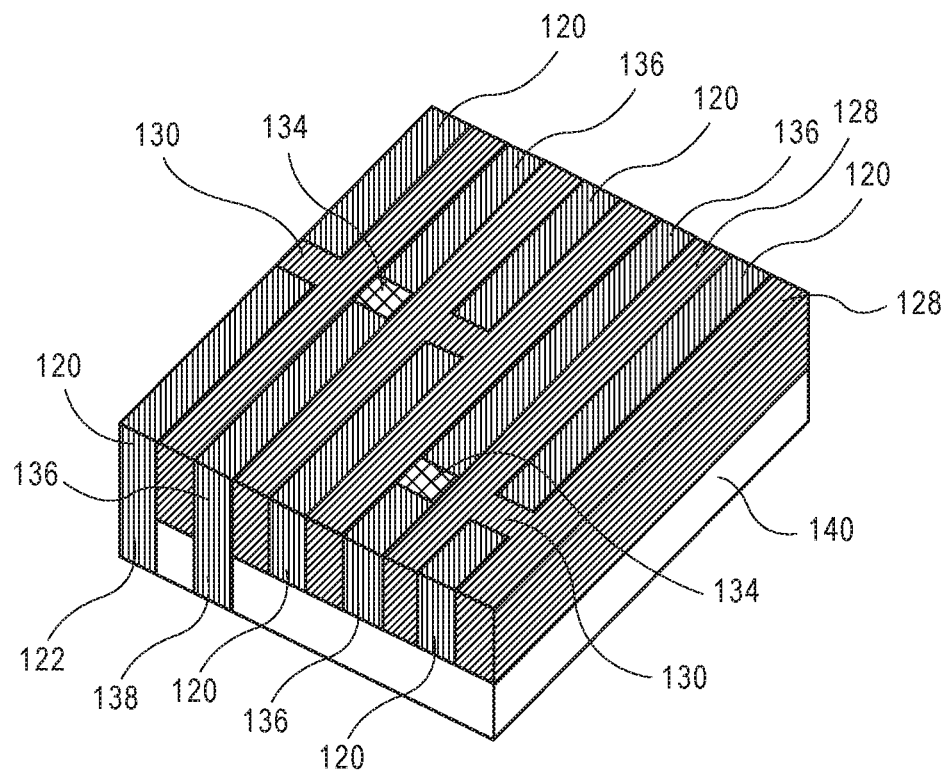

FIG. 1J illustrates the structure of FIG. 1I following a second metallization process. Interconnect lines 136 are formed in the openings (second line openings) formed upon patterning of the plug placeholder layer 132 to form plug placeholders 134. Additionally, although the separate processing operations are omitted from the figures, via openings, and ultimately conductive vias 138, may be formed in select locations below the conductive lines 136. Such a process results in a double patterned (two different via patterning operations) ILD layer 140, as is depicted in FIG. 1J.

In an embodiment, a metal fill process is performed to provide interconnect lines 136 and conductive vias 138. In an embodiment, the metal fill process is performed using a metal deposition and subsequent planarization processing scheme, such as a chemical mechanical planarization (CMP) process. In the case that the spacers 128 are composed substantially of silicon, a liner material may be deposited prior to forming a conductive fill layer, in order to inhibit silicidation of the spacers 128.

It is to be appreciated that, in an embodiment, since interconnect lines 136 (and corresponding conductive vias 138) are formed in a later process than the process used to fabricate interconnect lines 120 (and corresponding conductive vias 122), the interconnect lines 136 can be fabricated using a different material than is used to fabricate the conductive lines 120. In one such embodiment, a metallization layer ultimately includes conductive interconnects of alternating, differing first and second compositions.

Figure 1K:
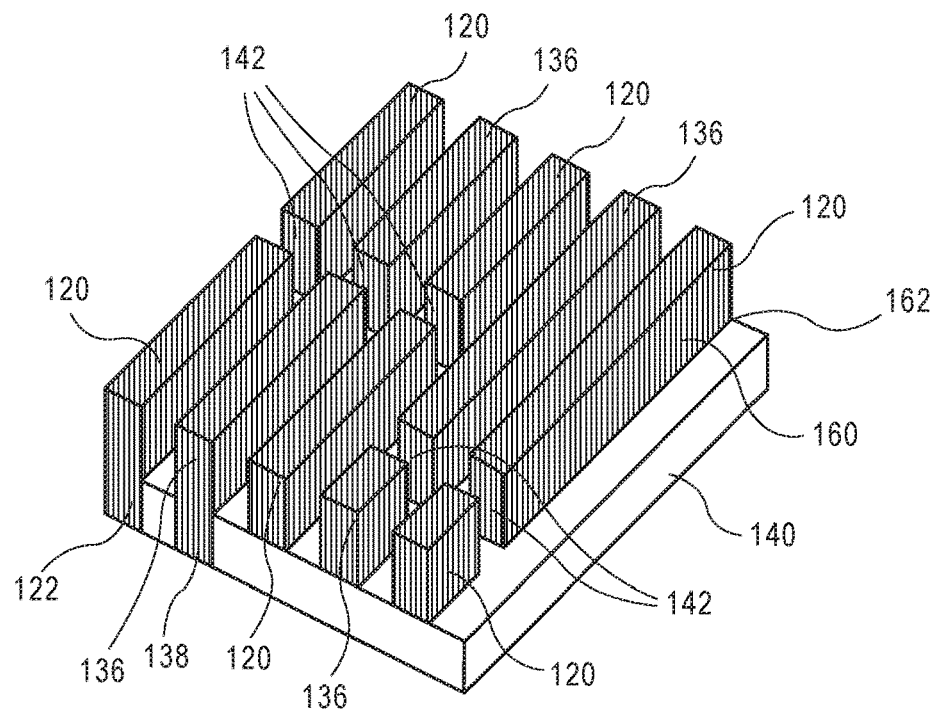

FIG. 1K illustrates the structure of FIG. 1J following exposure of the two sets of interconnect lines 120 and 136. The spacers 128, the line end placeholder portions 130, and the plug placeholders 134 are removed to leave interconnect lines 120 and 136 exposed, with underlying conductive vias 122 and 138, respectively, in the patterned ILD layer 140. Line end openings 142 are revealed. Line end openings 142 provide breaks in the grating pattern of the interconnect lines 120 and in the grating pattern of the interconnect lines 136. In an embodiment, the spacers 128, the line end placeholder portions 130, and the plug placeholders 134 are removed using a selective wet etch process.

In an embodiment, the structure of FIG. 1K represents a final metallization structure having an air gap architecture. That is, since the interconnect lines 120 and 136 are ultimately exposed in the process described herein, an air gap architecture is enabled. In another embodiment, since the interconnect lines 120 and 136 are exposed at this stage in the process, there is an opportunity to remove sidewall portions of a diffusion barrier layer of the interconnect lines. For example, in one embodiment, removal of such a diffusion barrier layer physically thins the conductive features of the interconnect lines 120 and 136. In another embodiment, resistance of such interconnect lines 120 and 136 is reduced upon removal of sidewall portions of such a diffusion barrier layer. As labeled in FIG. 1K, features sidewall portions 160 of interconnect lines 120 and 136 are exposed, while portions 162 beneath the lines are not. As such, in one embodiment, a diffusion barrier layer of interconnect lines 120 and 136 is removed from the sidewalls 160 of the interconnect lines 120 and 136 but not from regions 162 of the interconnect lines 120 and 136. In a particular embodiment, removal of sidewall portions of such a diffusion barrier layer involves removal of a Ta and/or TaN layer.

Thus, with reference to operations 1A-1K, in an embodiment, a method of fabricating a back end of line (BEOL) metallization layer includes forming a plurality of conductive lines 120/136 in a sacrificial material 128 formed above a substrate. Each of the plurality of conductive lines 120/136 includes a barrier layer formed along a bottom of and sidewalls a conductive fill layer. The sacrificial material 128 is then removed. The barrier layer is removed from the sidewalls of the conductive fill layer (e.g., at locations 160). In one embodiment, removing the barrier layer from the sidewalls of the conductive fill layer includes removing a tantalum or tantalum nitride layer from sidewalls of a conductive fill layer including a material selected from the group consisting of Cu, Al, Ti, Zr, Hf, V, Ru, Co, Ni, Pd, Pt, Cu, W, Ag, Au and alloys thereof.

Figure 1L:
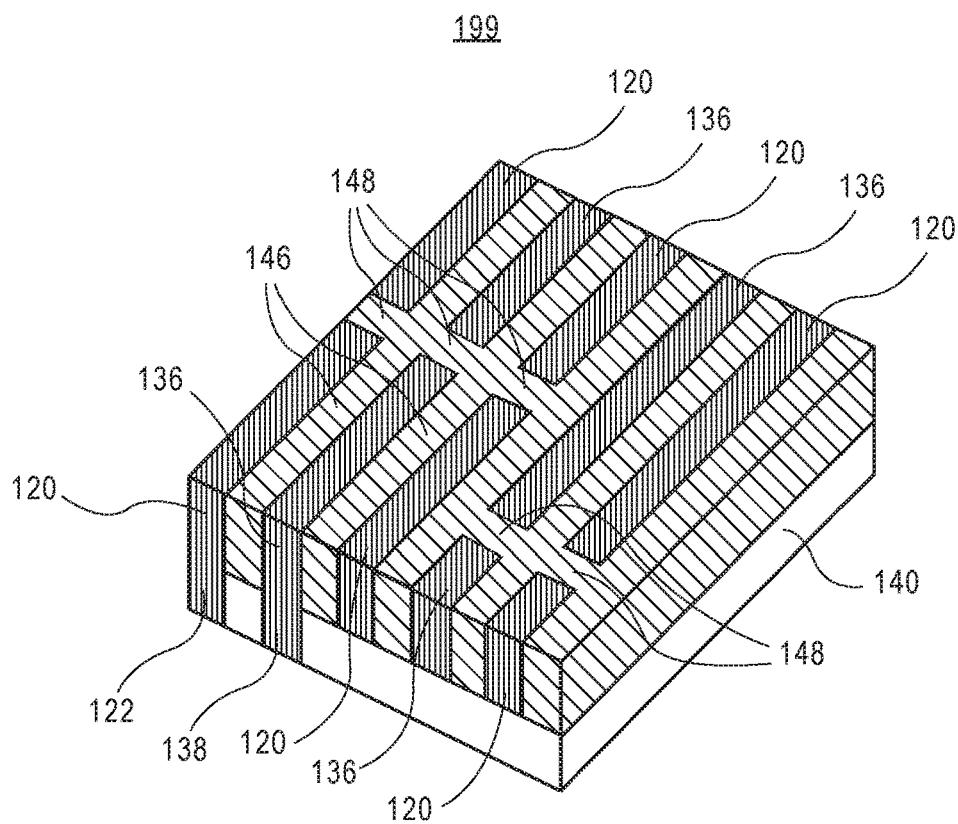

FIG. 1L illustrates the structure of FIG. 1K following formation of a permanent ILD layer. Inter-layer dielectric (ILD) layer 146/148 is formed among the interconnect lines 120 and 136. The ILD layer 146/148 includes portions 146 between interconnect lines 120 and 136. The ILD layer 146/148 also includes line end (or dielectric plug) portions 148 between at locations of the line breaks of the interconnect lines 120 and 136.

Referring again to FIG. 1L, in an embodiment, a semiconductor structure 199 includes a substrate (underlying ILD layer 140 of which is shown). A plurality of alternating first 120 and second 136 conductive line types is disposed along a same direction of a back end of line (BEOL) metallization layer disposed above the substrate. In one embodiment, as described in association with FIG. 1K, a total composition of the first conductive line type 120 is different from a total composition of the second conductive line type 136. In a specific such embodiment, the total composition of the first conductive line type 120 is substantially composed of copper, and the total composition of the second conductive line type 136 is substantially composed of a material selected from the group consisting of Al, Ti, Zr, Hf, V, Ru, Co, Ni, Pd, Pt, Cu, W, Ag, Au and alloys thereof, or vice versa. However, in another embodiment, a total composition of the first conductive line type 120 is the same as a total composition of the second conductive line type 136.

In an embodiment, the lines of the first conductive line type 120 are spaced apart by a pitch, and the lines of the second conductive line type 136 are spaced apart by the same pitch. In one embodiment, the plurality of alternating first and second conductive line types is disposed in an inter-layer dielectric (ILD) layer 146/148. In another embodiment, however, the lines of the plurality of alternating first and second conductive line types 120/136 are separated by an air gap, as described in association with FIG. 1K.

In an embodiment, the lines of the plurality of alternating first and second conductive line types 120/136 each include a barrier layer disposed along a bottom of and sidewalls of the line. In another embodiment, however, the lines of the plurality of alternating first and second conductive line types 120/136 each include a barrier layer disposed along a bottom 162 of the line but not along sidewalls 160 of the line, as was described in an embodiment of FIG. 1K. In one embodiment, one or more of the lines of the plurality of alternating first and second conductive line types is connected to an underlying via 122/138 connected to an underlying metallization layer of the semiconductor structure. In an embodiment, one or more of the lines of the plurality of alternating first and second conductive line types 120/136 is interrupted by a dielectric plug 148.

A resulting structure 199 such as described in association with FIG. 1L (or the air gap structure of FIG. 1K) may subsequently be used as a foundation for forming subsequent metal line/via and ILD layers. Alternatively, the structure 199 of FIG. 1L (or the structure of FIG. 1K) may represent the final metal interconnect layer in an integrated circuit. It is to be appreciated that the above process operations may be practiced in alternative sequences, not every operation need be performed and/or additional process operations may be performed. It is also to be appreciated that the above examples have focused on metal line and plug or line end formation. However, in other embodiments, similar approaches may be used to form via openings in an ILD layer.

Although the above method of fabricating a metallization layer of a BEOL metallization layer has been described in detail with respect to select operations, it is to be appreciated that additional or intermediate operations for fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, and/or any other associated action with microelectronic component fabrication.

In an embodiment, as used throughout the present description, an interlayer dielectric (ILD) material is composed of or includes a layer of a dielectric or insulating material. Examples of suitable dielectric materials include, but are not limited to, oxides of silicon (e.g., silicon dioxide ($SiO_2$)), nitrides of silicon (e.g., silicon nitride ($Si_3N_4$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers, stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Al, Ti, Zr, Hf, V, Ru, Co, Ni, Pd, Pt, Cu, W, Ag, Au or alloys thereof. The interconnect lines are also sometimes referred to in the art as traces, wires, lines, metal, or simply interconnect.

In an embodiment, as is also used throughout the present description, hardmask materials (and in some instances etch stop layers) are composed of dielectric materials different from the interlayer dielectric material. In one embodiment, different hardmask materials may be used in different regions so as to provide different growth or etch selectivity to each other and to the underlying dielectric and metal layers. In some embodiments, a hardmask layer includes a layer of a nitride of silicon (e.g., silicon nitride) or a layer of an oxide of silicon, or both, or a combination thereof. Other suitable materials may include carbon-based materials, such as silicon carbide. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the art may be used depending upon the particular implementation. The hardmask layers may be formed by CVD, PVD, or by other deposition methods.

It is to be appreciated that the layers and materials described in association with FIGS. 1A-1L are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structure depicted in FIG. 1L (i.e., as starting from FIG. 1A) may be fabricated on underlying lower level interconnect layers.

As described above, patterned features may be patterned in a grating-like pattern with lines, holes or trenches spaced at a constant pitch and having a constant width. The pattern, for example, may be fabricated by a pitch halving or pitch quartering approach. In an example, a blanket film (such as a polycrystalline silicon film) is patterned using lithography and etch processing which may involve, e.g., spacer-based-quadruple-patterning (SBQP) or pitch quartering. It is to be appreciated that a grating pattern of lines can be fabricated by numerous methods, including 193 nm immersion litho (i193), EUV and/or EBDW lithography, directed self-assembly, etc.

Figure 2A:
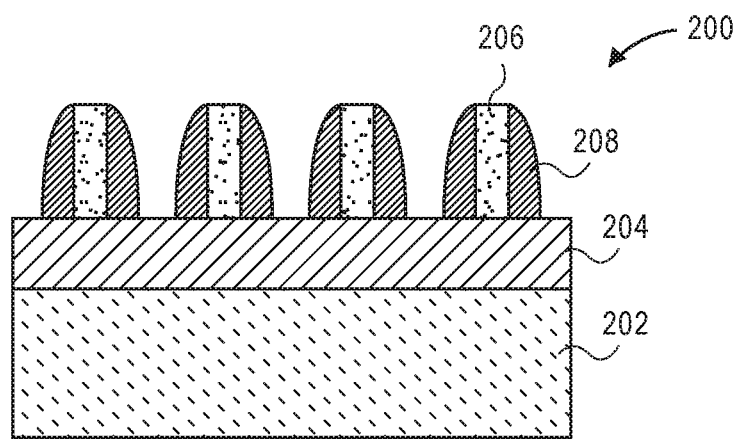
FIG. 2A illustrates a cross-sectional view of a starting structure following deposition, but prior to patterning, of a hardmask material layer formed on an interlayer dielectric (ILD) layer, in accordance with an embodiment of the present invention.
Figure 2B:
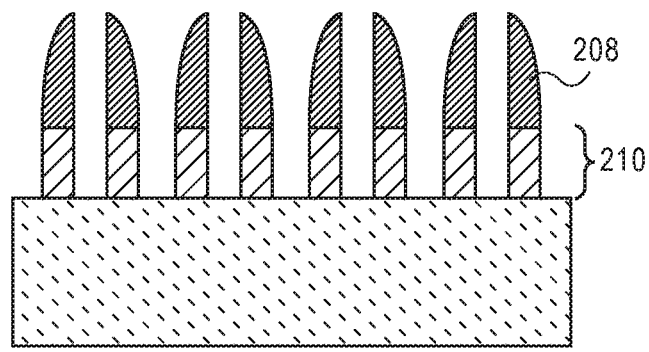
FIG. 2B illustrates a cross-sectional view of the structure of FIG. 2A following patterning of the hardmask layer by pitch halving, in accordance with an embodiment of the present invention.

In an embodiment, pitch division techniques are used to increase a line density. In a first example, pitch halving can be implemented to double the line density of a fabricated grating structure. FIG. 2A illustrates a cross-sectional view of a starting structure following deposition, but prior to patterning, of a hardmask material layer formed on an interlayer dielectric (ILD) layer. FIG. 2B illustrates a cross-sectional view of the structure of FIG. 2A following patterning of the hardmask layer by pitch halving.

Referring to FIG. 2A, a starting structure 200 has a hardmask material layer 204 formed on an interlayer dielectric (ILD) layer 202. A patterned mask 206 is disposed above the hardmask material layer 204. The patterned mask 206 has spacers 208 formed along sidewalls of features (lines) thereof, on the hardmask material layer 204.

Referring to FIG. 2B, the hardmask material layer 204 is patterned in a pitch halving approach. Specifically, the patterned mask 206 is first removed. The resulting pattern the spacers 208 has double the density, or half the pitch or the features of the mask 206. The pattern of the spacers 208 is transferred, e.g., by an etch process, to the hardmask material layer 204 to form a patterned hardmask 210, as is depicted in FIG. 2B. In one such embodiment, the patterned hardmask 210 is formed with a grating pattern having unidirectional lines. The grating pattern of the patterned hardmask 210 may be a tight pitch grating structure. For example, the tight pitch may not be achievable directly through conventional lithography techniques. Even further, although not shown, the original pitch may be quartered by a second round of spacer mask patterning. Accordingly, the grating-like pattern of the patterned hardmask 210 of FIG. 2B may have hardmask lines spaced at a constant pitch and having a constant width relative to one another. The dimensions achieved may be far smaller than the critical dimension of the lithographic technique employed. Accordingly, a blanket film may be patterned using lithography and etch processing which may involve, e.g., spacer-based-double-patterning (SBDP) or pitch halving, or spacer-based-quadruple-patterning (SBQP) or pitch quartering.

Figure 3:
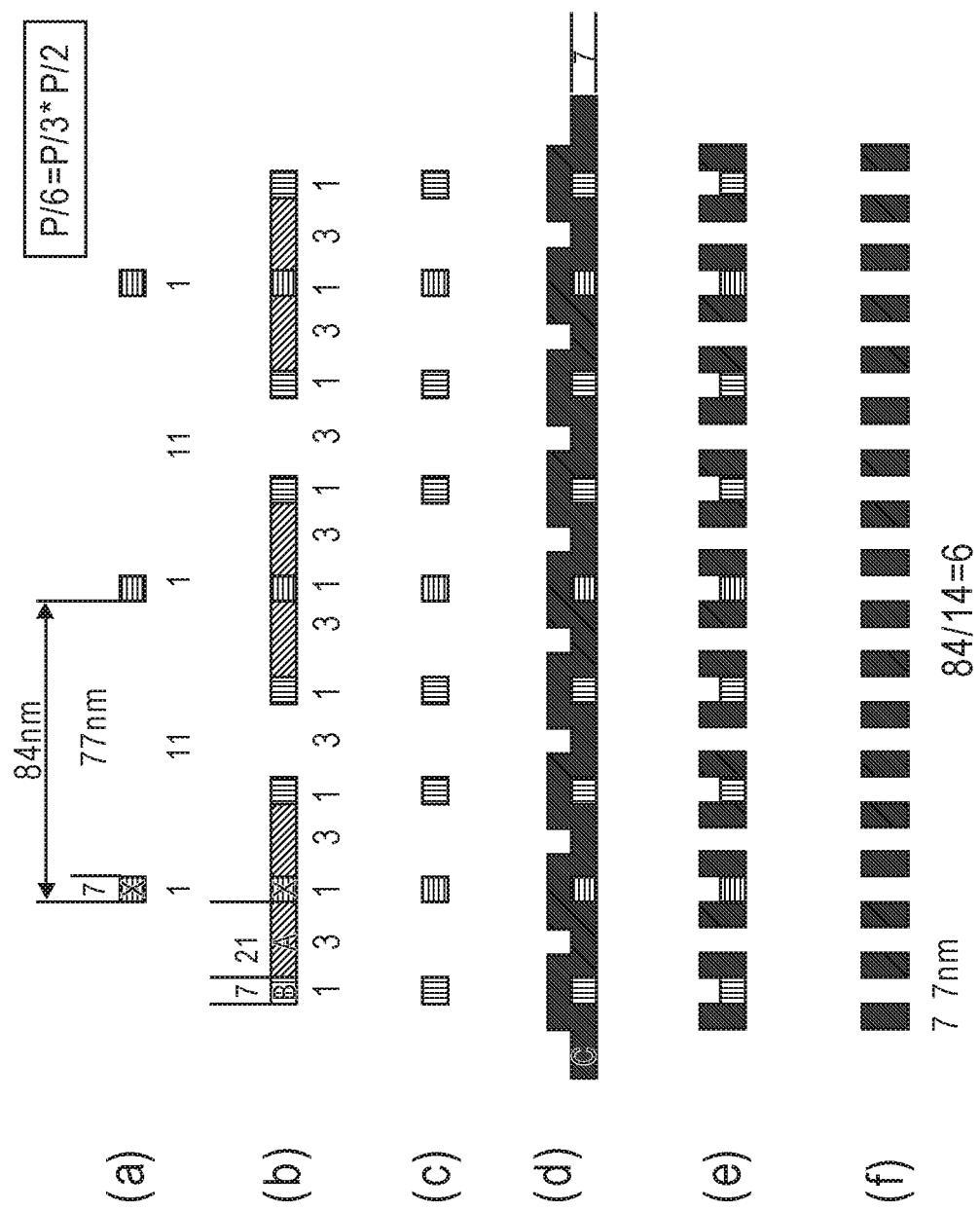
FIG. 3 illustrates cross-sectional views in a spacer-based-sextuple-patterning (SBSP) processing scheme which involves pitch division by a factor of six, in accordance with an embodiment of the present invention.

It is to be appreciated that other pitch division approaches may also be implemented. For example, FIG. 3 illustrates cross-sectional views in a spacer-based-sextuple-patterning (SBSP) processing scheme which involves pitch division by a factor of six. Referring to FIG. 3, at operation (a), a sacrificial pattern X is shown following litho, slim and etch processing. At operation (b), spacers A and B are shown following deposition and etching. At operation (c), the pattern of operation (b) is shown following spacer A removal. At operation (d), the pattern of operation (c) is shown following spacer C deposition. At operation (e), the pattern of operation (d) is shown following spacer C etch. At operation (f), a pitch/6 pattern is achieved following sacrificial pattern X removal and spacer B removal.

In an embodiment, lithographic operations are performed using 193 nm immersion litho (i193), EUV and/or EBDW lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 4:
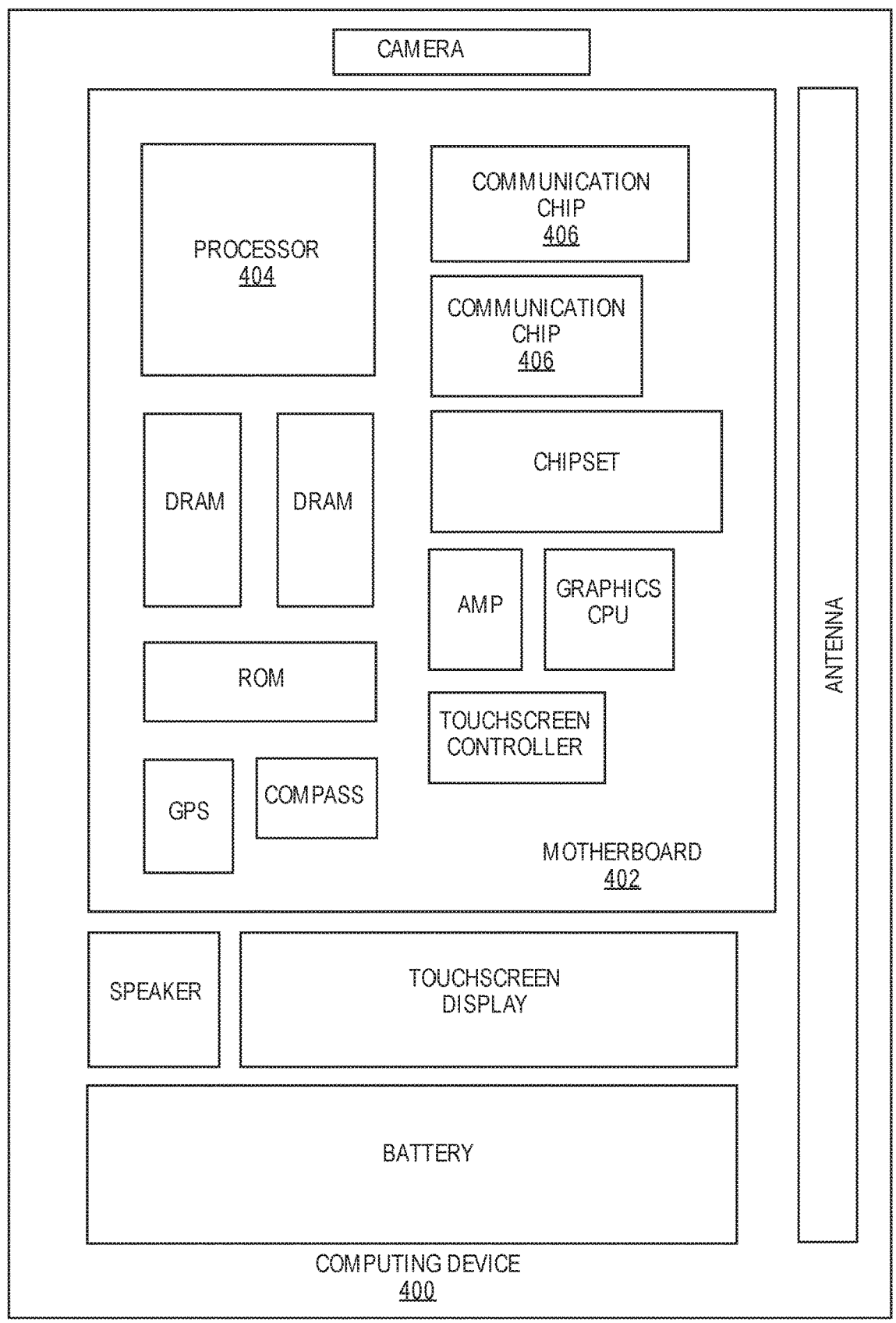
FIG. 4 illustrates a computing device in accordance with one implementation of the invention.

FIG. 4 illustrates a computing device 400 in accordance with one implementation of the invention. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

Depending on its applications, computing device 400 may include other components that may or may not be physically and electrically coupled to the board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In some implementations of the invention, the integrated circuit die of the processor includes one or more structures, such as BEOL metallization layers, built in accordance with implementations of the invention. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406. In accordance with another implementation of the invention, the integrated circuit die of the communication chip includes one or more structures, such as BEOL metallization layers, built in accordance with implementations of the invention.

In further implementations, another component housed within the computing device 400 may contain an integrated circuit die that includes one or more structures, such as BEOL metallization layers, built in accordance with implementations of the invention.

In various implementations, the computing device 400 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

Figure 5:
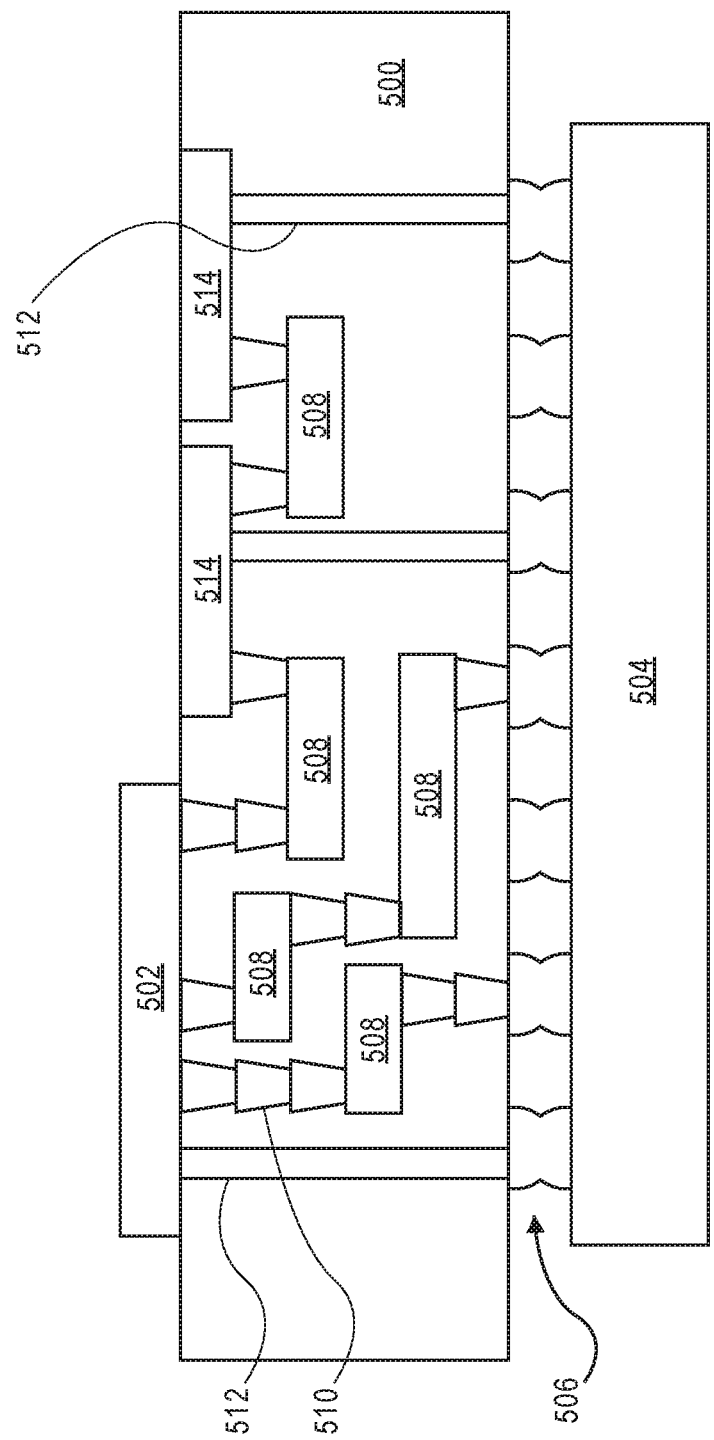
FIG. 5 is an interposer implementing one or more embodiments of the invention.

FIG. 5 illustrates an interposer 500 that includes one or more embodiments of the invention. The interposer 500 is an intervening substrate used to bridge a first substrate 502 to a second substrate 504. The first substrate 502 may be, for instance, an integrated circuit die. The second substrate 504 may be, for instance, a memory module, a computer motherboard, or another integrated circuit die. Generally, the purpose of an interposer 500 is to spread a connection to a wider pitch or to reroute a connection to a different connection. For example, an interposer 500 may couple an integrated circuit die to a ball grid array (BGA) 506 that can subsequently be coupled to the second substrate 504. In some embodiments, the first and second substrates 502/504 are attached to opposing sides of the interposer 500. In other embodiments, the first and second substrates 502/504 are attached to the same side of the interposer 500. And in further embodiments, three or more substrates are interconnected by way of the interposer 500.

The interposer 500 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 508 and vias 510, including but not limited to through-silicon vias (TSVs) 512. The interposer 500 may further include embedded devices 514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, and MEMS devices may also be formed on the interposer 500. In accordance with embodiments of the invention, apparatuses or processes disclosed herein may be used in the fabrication of interposer 500.

Thus, embodiments of the present invention include pitch division patterning approaches with increased overlay margin for back end of line (BEOL) interconnect fabrication, and the resulting structures.

In an embodiment, a semiconductor structure includes a substrate. A plurality of alternating first and second conductive line types is disposed along a same direction of a back end of line (BEOL) metallization layer disposed above the substrate. A total composition of the first conductive line type is different from a total composition of the second conductive line type.

In one embodiment, the lines of the first conductive line type are spaced apart by a pitch, and the lines of the second conductive line type are spaced apart by the pitch.

In one embodiment, the plurality of alternating first and second conductive line types is disposed in an inter-layer dielectric (ILD) layer.

In one embodiment, the lines of the plurality of alternating first and second conductive line types are separated by an air gap.

In one embodiment, the total composition of the first conductive line type is substantially composed of copper, and the total composition of the second conductive line type is substantially composed of a material selected from the group consisting of Al, Ti, Zr, Hf, V, Ru, Co, Ni, Pd, Pt, Cu, W, Ag, Au and alloys thereof.

In one embodiment, the lines of the plurality of alternating first and second conductive line types each include a barrier layer disposed along a bottom of and sidewalls of the line.

In one embodiment, the lines of the plurality of alternating first and second conductive line types each include a barrier layer disposed along a bottom of the line but not along sidewalls of the line.

In one embodiment, one or more of the lines of the plurality of alternating first and second conductive line types is connected to an underlying via connected to an underlying metallization layer of the semiconductor structure, and one or more of the lines of the plurality of alternating first and second conductive line types is interrupted by a dielectric plug.

In an embodiment, a semiconductor structure incudes a substrate. A plurality of alternating first and second conductive line types is disposed along a same direction of a back end of line (BEOL) metallization layer disposed above the substrate. The lines of the plurality of alternating first and second conductive line types each include a barrier layer disposed along a bottom of the line but not along sidewalls of the line.

In one embodiment, the lines of the first conductive line type are spaced apart by a pitch, and the lines of the second conductive line type are spaced apart by the pitch.

In one embodiment, the plurality of alternating first and second conductive line types is disposed in an inter-layer dielectric (ILD) layer.

In one embodiment, the lines of the plurality of alternating first and second conductive line types are separated by an air gap.

In one embodiment, a total composition of the first conductive line type is the same as a total composition of the second conductive line type.

In one embodiment, a total composition of the first conductive line type is composed substantially of copper, and a total composition of the second conductive line type is composed substantially of a material selected from the group consisting of Al, Ti, Zr, Hf, V, Ru, Co, Ni, Pd, Pt, Cu, W, Ag, Au and alloys thereof.

In one embodiment, one or more of the lines of the plurality of alternating first and second conductive line types is connected to an underlying via connected to an underlying metallization layer of the semiconductor structure, and one or more of the lines of the plurality of alternating first and second conductive line types is interrupted by a dielectric plug.

In an embodiment, a method of fabricating a back end of line (BEOL) metallization layer includes forming a first plurality of conductive lines in a first sacrificial material formed above a substrate. The first plurality of conductive lines is formed along a direction of the BEOL metallization layer and is spaced apart by a pitch. The method also includes removing the first sacrificial material. The method also includes forming a second sacrificial material adjacent to sidewalls of the first plurality of conductive lines. The method also includes forming a second plurality of conductive lines adjacent the second sacrificial material. The second plurality of conductive lines is formed along the direction of the BEOL metallization layer, is spaced apart by the pitch, and is alternating with the first plurality of conductive lines. The method also includes removing the second sacrificial layer.

In one embodiment, the method further includes, subsequent to forming the second sacrificial material and prior to forming the second plurality of conductive lines, forming plug regions for the second plurality of conductive lines.

In one embodiment, the method further includes, subsequent to removing the second sacrificial layer, forming a permanent inter-layer dielectric (ILD) layer among the first and second pluralities of conductive lines.

In one embodiment, the first plurality of conductive lines is formed using a pitch division patterning process.

In one embodiment, a total composition of the first plurality of conductive lines is different from a total composition of the second plurality of conductive lines.

In one embodiment, a total composition of the first plurality of conductive lines is the same as a total composition of the second plurality of conductive lines.

In one embodiment, the method further includes, subsequent to removing the second sacrificial layer, removing a barrier layer from sidewalls of the first and second pluralities of conductive lines.

In an embodiment, a method of fabricating a back end of line (BEOL) metallization layer includes forming a plurality of conductive lines in a sacrificial material formed above a substrate. Each of the plurality of conductive lines includes a barrier layer formed along a bottom of and sidewalls a conductive fill layer. The method also includes removing the sacrificial material. The method also includes removing the barrier layer from the sidewalls of the conductive fill layer.

In one embodiment, the method further includes, subsequent to removing the barrier layer from the sidewalls of the conductive fill layer, forming a permanent inter-layer dielectric (ILD) layer among the plurality of conductive lines.

In one embodiment, removing the barrier layer from the sidewalls of the conductive fill layer includes removing a tantalum or tantalum nitride layer from sidewalls of a conductive fill layer including a material selected from the group consisting of Cu, Al, Ti, Zr, Hf, V, Ru, Co, Ni, Pd, Pt, Cu, W, Ag, Au and alloys thereof.

What is claimed is:

1. A semiconductor structure, comprising:
    a substrate; and
    a plurality of alternating first and second conductive line types disposed along a same direction of a back end of line (BEOL) metallization layer disposed above the substrate, wherein a total composition of the first conductive line type is different from a total composition of the second conductive line type, and wherein a bottom surface of one of the first conductive line types is co-planar with a bottom surface of one of the second conductive line types.

2. The semiconductor structure of claim 1, wherein the lines of the first conductive line type are spaced apart by a pitch, and wherein the lines of the second conductive line type are spaced apart by the pitch.

3. The semiconductor structure of claim 1, wherein the plurality of alternating first and second conductive line types is disposed in an inter-layer dielectric (ILD) layer.

4. The semiconductor structure of claim 1, wherein the lines of the plurality of alternating first and second conductive line types are separated by an air gap.

5. The semiconductor structure of claim 1, wherein the total composition of the first conductive line type substantially comprises copper, and wherein the total composition of the second conductive line type substantially comprises a material selected from the group consisting of Al, Ti, Zr, Hf, V, Ru, Co, Ni, Pd, Pt, Cu, W, Ag, Au and alloys thereof.

6. The semiconductor structure of claim 1, wherein the lines of the plurality of alternating first and second conductive line types each comprise a barrier layer disposed along a bottom of and sidewalls of the line.

7. The semiconductor structure of claim 1, wherein the lines of the plurality of alternating first and second conductive line types each comprise a barrier layer disposed along a bottom of the line but not along sidewalls of the line.

8. The semiconductor structure of claim 1, wherein one or more of the lines of the plurality of alternating first and second conductive line types is connected to an underlying via connected to an underlying metallization layer of the semiconductor structure, and wherein one or more of the lines of the plurality of alternating first and second conductive line types is interrupted by a dielectric plug.

9. A semiconductor structure, comprising:
    a substrate; and
    a plurality of alternating first and second conductive line types disposed along a same direction of a back end of line (BEOL) metallization layer disposed above the substrate, wherein the lines of the plurality of alternating first and second conductive line types each comprise a barrier layer disposed along a bottom of the line but not along sidewalls of the line, wherein the lines of the plurality of alternating first and second conductive line types are separated by an air gap.

10. The semiconductor structure of claim 9, wherein the lines of the first conductive line type are spaced apart by a pitch, and wherein the lines of the second conductive line type are spaced apart by the pitch.

11. The semiconductor structure of claim 9, wherein the plurality of alternating first and second conductive line types is disposed in an inter-layer dielectric (ILD) layer.

12. The semiconductor structure of claim 9, wherein a total composition of the first conductive line type is the same as a total composition of the second conductive line type.

13. The semiconductor structure of claim 9, wherein a total composition of the first conductive line type substantially comprises copper, and wherein a total composition of the second conductive line type substantially comprises a material selected from the group consisting of Al, Ti, Zr, Hf, V, Ru, Co, Ni, Pd, Pt, Cu, W, Ag, Au and alloys thereof.

14. The semiconductor structure of claim 9, wherein one or more of the lines of the plurality of alternating first and second conductive line types is connected to an underlying via connected to an underlying metallization layer of the semiconductor structure, and wherein one or more of the lines of the plurality of alternating first and second conductive line types is interrupted by a dielectric plug.

15. A method of fabricating a back end of line (BEOL) metallization layer, the method comprising:
    forming a first plurality of conductive lines in a first sacrificial material formed above a substrate, the first plurality of conductive lines formed along a direction of the BEOL metallization layer and spaced apart by a pitch;
    removing the first sacrificial material;
    forming a second sacrificial material adjacent to sidewalls of the first plurality of conductive lines;
    forming a second plurality of conductive lines adjacent the second sacrificial material, the second plurality of conductive lines formed along the direction of the BEOL metallization layer and spaced apart by the pitch and alternating with the first plurality of conductive lines; and
    removing the second sacrificial layer.

16. The method of claim 15, further comprising:
    subsequent to forming the second sacrificial material and prior to forming the second plurality of conductive lines, forming plug regions for the second plurality of conductive lines.

17. The method of claim 15, further comprising:
    subsequent to removing the second sacrificial layer, forming a permanent inter-layer dielectric (ILD) layer among the first and second pluralities of conductive lines.

18. The method of claim 15, wherein the first plurality of conductive lines is formed using a pitch division patterning process.

19. The method of claim 15, wherein a total composition of the first plurality of conductive lines is different from a total composition of the second plurality of conductive lines.

20. The method of claim 15, wherein a total composition of the first plurality of conductive lines is the same as a total composition of the second plurality of conductive lines.

21. The method of claim 15, further comprising:
    subsequent to removing the second sacrificial layer, removing a barrier layer from sidewalls of the first and second pluralities of conductive lines.

22. A method of fabricating a back end of line (BEOL) metallization layer, the method comprising:
    forming a plurality of conductive lines in a sacrificial material formed above a substrate, each of the plurality of conductive lines each comprising a barrier layer disposed along a bottom of and sidewalls a conductive fill layer;

removing the sacrificial material; and removing the barrier layer from the sidewalls of the conductive fill layer.

23. The method of claim 22, further comprising:

subsequent to removing the barrier layer from the sidewalls of the conductive fill layer, forming a permanent inter-layer dielectric (ILD) layer among the plurality of conductive lines.

24. The method of claim 22, wherein removing the barrier layer from the sidewalls of the conductive fill layer comprises removing a tantalum or tantalum nitride layer from sidewalls of a conductive fill layer comprising a material selected from the group consisting of Cu, Al, Ti, Zr, Hf, V, Ru, Co, Ni, Pd, Pt, Cu, W, Ag, Au and alloys thereof.

25. A semiconductor structure, comprising:

a substrate; and a plurality of alternating first and second conductive line types disposed along a same direction of a back end of line (BEOL) metallization layer disposed above the substrate, wherein a total composition of the first conductive line type is different from a total composition of the second conductive line type, wherein the lines of the plurality of alternating first and second conductive line types each comprise a barrier layer disposed along a bottom of the line but not along sidewalls of the line.

26. A semiconductor structure, comprising:

a substrate; and a plurality of alternating first and second conductive line types disposed along a same direction of a back end of line (BEOL) metallization layer disposed above the substrate, wherein a total composition of the first conductive line type is different from a total composition of the second conductive line type, wherein one or more of the lines of the plurality of alternating first and second conductive line types is connected to an underlying via connected to an underlying metallization layer of the semiconductor structure, and wherein one or more of the lines of the plurality of alternating first and second conductive line types is interrupted by a dielectric plug.

* * * * *